(12) United States Patent
Todorov

(10) Patent No.: US 8,765,518 B1
(45) Date of Patent: Jul. 1, 2014

(54) CHALCOGENIDE SOLUTIONS

(71) Applicant: International Business Machines Corporation, Armonk, NY (US)

(72) Inventor: Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/795,692

(22) Filed: Mar. 12, 2013

(51) Int. Cl.
*H01L 21/00* (2006.01)
*H01L 21/16* (2006.01)

(52) U.S. Cl.
USPC ............... 438/95; 438/93; 438/104; 438/46

(58) Field of Classification Search
USPC ....................... 438/95, 93, 104, 46
See application file for complete search history.

(56) References Cited

U.S. PATENT DOCUMENTS

| | | | |
|---|---|---|---|
| 3,306,701 A | 2/1967 | Thomson et al. | |
| 3,390,090 A | 6/1968 | Taylor et al. | |
| 3,547,596 A | 12/1970 | Kolb | |
| 3,733,499 A | 5/1973 | Deis et al. | |
| 4,038,377 A | 7/1977 | Washall et al. | |
| 4,576,634 A | 3/1986 | Badesha et al. | |
| 6,537,845 B1 * | 3/2003 | McCandless et al. | 438/93 |
| 7,494,841 B2 | 2/2009 | Mitzi et al. | |
| 7,923,281 B2 * | 4/2011 | Basol et al. | 438/62 |
| 8,252,734 B1 * | 8/2012 | Schramm et al. | 508/162 |
| 2006/0062902 A1 * | 3/2006 | Sager et al. | 427/74 |
| 2008/0142084 A1 * | 6/2008 | Yu et al. | 136/264 |
| 2009/0159454 A1 * | 6/2009 | Machado et al. | 205/335 |

FOREIGN PATENT DOCUMENTS

| | | |
|---|---|---|
| CN | 101168663 A | 4/2008 |
| CN | 101575516 A | 11/2009 |

OTHER PUBLICATIONS

Pierce, C. I., Coker, V. S., Charnock, J. M. et al., "Microbial manufacture of chalcogenide-based nanoparticles via the reduction of selenite using *Veillonella atypica*: an in situ EXAFS study," Nanotechnology, 19, 1-13 (Mar. 2008), doi:10.1088/0957-4484/19/15/155603.

English version of CN101168663A Le Yang et al., Shanghai Institute of Technology Physics Apr. 30, 2008.

English version of CN101575516A Pang Daiwen et al., Wuhan University Nov. 11, 2009.

* cited by examiner

*Primary Examiner* — Karen Kusumakar
(74) *Attorney, Agent, or Firm* — Vazken Alexanian; Michael J. Chang, LLC

(57) ABSTRACT

Improved chalcogenide solutions are provided. In one aspect, a method of forming an aqueous selenium-containing solution is provided. The method includes the following step. Water, ammonium hydroxide, elemental selenium, and elemental aluminum are contacted under conditions sufficient to form the aqueous selenium-containing solution. The conditions may include sonication for a period of time of from about 1 minute to about 10 minutes and/or stirring for a period of time of from about 10 minutes to about 72 hours at a temperature of from about 20° C. to about 25° C. A method of fabricating a photovoltaic device is also provided.

12 Claims, 2 Drawing Sheets

CHALCOGENIDE SOLUTIONS

FIELD OF THE INVENTION

The present invention relates to improved chalcogenide solutions and more particularly, to techniques for forming aqueous selenium-containing solutions.

BACKGROUND OF THE INVENTION

The need for scalable synthesis of bulk and thin-film selenide semiconductor materials for photovoltaic and other applications creates a growing demand for low-cost reactive selenium sources. One example of such sources is aqueous solutions containing $Se^{2-}$ or poly-selenide ions, which can be used directly for synthesis of metal selenide materials by reacting said solutions with metal salts or other compounds.

While selenium is well-known to easily dissolve in alkali hydroxides and different methods of its reduction into solution have been proposed (see, for example, U.S. Pat. No. 3,390,090 issued to Taylor et al., entitled "Metallic Selenides and Tellurides and Process for Making Same"), the introduction of metal counter ions, particularly alkalis may compromise the purity of the obtained semiconductor product. Ammonium counter-ions are preferred for stabilizing the reactive aqueous selenium solutions as they allow reaching high selenium concentrations (above 30%) and do not introduce metal impurities in the targeted semiconductor product.

Elemental selenium is one of the lowest-cost selenium sources for preparing ammonium selenide solutions. U.S. patent application Ser. No. 13/207,248 filed by Mitzi et al., entitled "Process for the Preparation of Elemental Chalcogen Solutions and Method of Employing Said Solutions in Preparation of Kesterite Films" describe the use of ammonia borane as a highly efficient reducing agent that was successfully applied for selenium solution preparation. However, challenges such as vigorous dissolution reaction, creating a potential for $H_2Se$ release and the high price of ammonia borane need to be addressed in order to reduce the cost of its large-scale application.

Aluminum selenide was proposed as another convenient source for preparing ammonium selenide solutions (see for example U.S. Pat. No. 3,306,701 issued to Thomson et al., entitled "Preparation of Selenides and Tellurides") and was used for different metal selenide synthesis. The method can be summarized in two reactions:

$$2Al + 3Se \rightarrow Al_2Se_3 \quad (1)$$

$$Al_2Se_3 + 6NH_4OH \rightarrow 3(NH_4)_2Se + 2Al(OH)_3 \quad (2)$$

However, the synthesis of aluminum selenide proceeds through the highly exothermic reaction between elemental aluminum and selenium (Equation 1), requiring heavy-duty synthesis equipment operating in an inert atmosphere, resulting in an unusually high price for this reagent. The reaction of aluminum selenide with ammonium hydroxide (Equation 2) is also exothermic, creating a potential for $H_2Se$ release.

While engineering improvements of methods found in the above-described conventional processes may reduce their cost and make them practical for large-scale selenium solution manufacturing, no convenient method has yet been found for the direct formation of metal-free reactive selenium solutions from elemental selenium.

Thus, improved techniques for the formation of metal-free reactive selenium solutions from elemental selenium would be desirable.

SUMMARY OF THE INVENTION

The present invention provides improved chalcogenide solutions. In one aspect of the invention, a method of forming an aqueous selenium-containing solution is provided. The method includes the following step. Water, ammonium hydroxide, elemental selenium, and elemental aluminum are contacted under conditions sufficient to form the aqueous selenium-containing solution. The conditions may include sonication for a period of time of from about 1 minute to about 10 minutes and/or stirring for a period of time of from about 10 minutes to about 72 hours at a temperature of from about 20° C. to about 25° C.

In another aspect of the invention, a method of fabricating a photovoltaic device is provided. The method includes the following steps. An aqueous selenium-containing solution is contacted with a solution containing one or more of copper, zinc and tin to form a slurry. The aqueous selenium-containing solution is formed by (a) contacting i) water, ii) ammonium hydroxide, iii) elemental selenium, and iv) elemental aluminum under conditions sufficient to form the aqueous selenium-containing solution and (b) filtering the aqueous selenium-containing solution to separate insoluble materials from the aqueous selenium-containing solution. The slurry is deposited onto a substrate. The water is removed from the slurry to form an absorber layer on the substrate.

A more complete understanding of the present invention, as well as further features and advantages of the present invention, will be obtained by reference to the following detailed description and drawings.

DETAILED DESCRIPTION OF PREFERRED EMBODIMENTS

Figure 1:
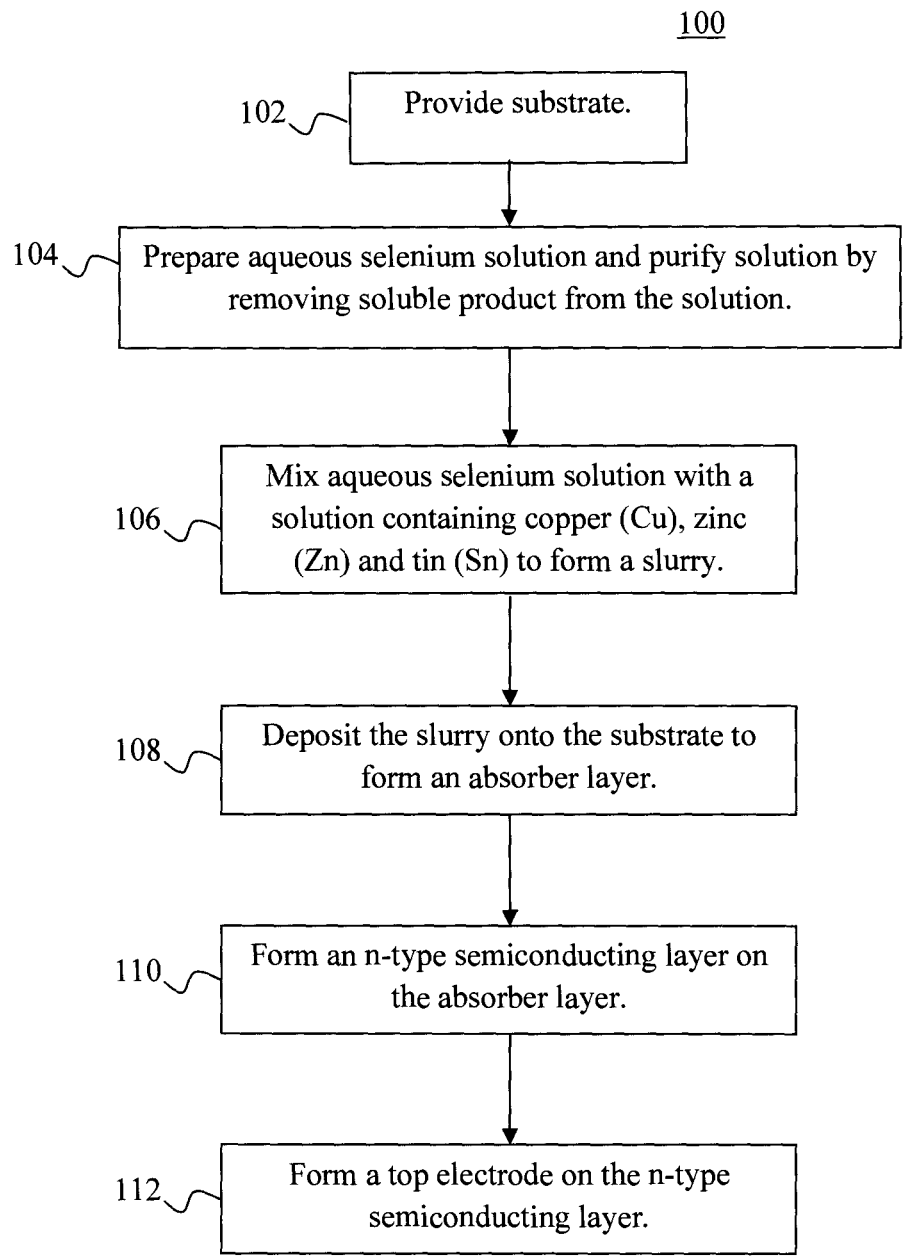
FIG. 1 is a diagram illustrating an exemplary methodology for fabricating a photovoltaic device according to an embodiment of the present invention.

Provided herein are techniques for dissolving elemental selenium (Se) in the form of ammonium selenide. The process includes bringing into contact: i) water, ii) ammonium hydroxide, iii) elemental selenium, and iv) elemental aluminum under conditions sufficient to form an aqueous solution containing selenium.

The process conditions can optionally include sonication for a period of time of from about 1 minute to about 10 minutes, and ranges therebetween and/or stirring for a period of time of from about 10 minutes to about 72 hours, and ranges therebetween. The process (i.e., bringing into contact the reagents, sonicating, stirring, etc.) are all conducted at room temperature which is defined herein as a temperature of from about 20 degrees Celsius (° C.) to about 25° C., and ranges therebetween.

The overall reaction may be described by the following non-limiting exemplary equation:

$$2Al + 3Se + 6NH_4OH \rightarrow 2Al(OH)_3 + 3(NH_4)_2Se.$$

One advantage of the present process over conventional processes is the cost of the reagents. Namely, the present techniques employ significantly lower-cost reagents than the conventional art. For instance, elemental selenium is currently over $60 per pound. By comparison, aluminum costs about $1 per kilogram and ammonium hydroxide costs about $0.55 per kilogram. Another advantage of the present process is that it involves a facile one-step dissolution reaction requiring no sophisticated equipment. Yet another advantage of the present process is that it involves a mild reaction progression, with little or no need for heating or cooling of the reactor.

The present process employs the reducing action of aluminum to convert partially or completely elemental selenium to $Se^{2-}$ ions. Insoluble aluminum oxide/hydroxide is formed as a side product. The aluminum oxide/hydroxide can be separated from the mixture by standard techniques including, but not limited to, centrifugation and filtration. The reaction is relatively slow and proceeds without noticeable release of gas or heat.

If the process is not terminated after the end of the selenium reduction, potential for $H_2$ generation is present:

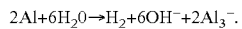

$$2Al+6H_2O \rightarrow H_2+6OH^-+2Al_3^-.$$

The generation of $H_2$ may be undesirable in industrial processes due to the potential for pressure buildup. Thus, in such cases, the separation of the solids from the solution is preferably effectuated not later than Se reduction completion. The Se reduction completion can be easily monitored by color change from red to colorless (i.e., transparent).

The resulting selenium contained in the aqueous solution can be completely or partially reduced, i.e., transparent or red in color. The selenium produced in this manner can be used for the synthesis of selenide materials for a variety of different applications including, but not limited to, the production of selenium-containing layers for photovoltaic applications. By way of example only, the present techniques may be used as a low-cost and efficient method for obtaining the selenium precursors needed for the production of solar cell materials, such as CIGS, CZTS/Se, etc. absorber layer materials.

The terms "fully" or "completely" reduced as used herein refer to the case when all of the Se is in the form of $Se^{2-}$ ions (i.e., which is indicated by the solution being completely clear and pale). When dried at moderate temperatures, the solution leaves no elemental Se residue. If one were to add even a small amount of elemental selenium (without the presence of a reducing agent such as aluminum) to the above solution the elemental selenium would dissolve, but the resulting solution would be intense red in color. It is believed to be due to the presence of polyselenide ions in the solution, i.e., not all of the Se is in the form of $Se^{2-}$ ions. When evaporated, this solution starts precipitating elemental selenium before even completely drying. This indicates that the Se is not fully reduced to $Se^{2-}$ ions.

The selenium solutions obtained as described above can be used to further dissolve additional amounts of (elemental) selenium and/or chalcogenides (such as tin sulfide (SnS)) for coating or other applications. According to an exemplary embodiment, the aqueous selenium-containing solution is contacted with i) additional amounts of elemental selenium to increase a selenium concentration in the aqueous selenium-containing solution and/or ii) a chalcogenide(s)—so as to dissolve the chalcogenide(s) in the solution. Addition of selenium to the purified clear solution (i.e., instead of during the original ammonium selenide synthesis) allows for more precise control over the ratio of reduced/unreduced species. Resulting solutions can be used for depositing elemental Se layers, SnSe or Sn(S,Se) layers.

The selenium solution prepared according to the present techniques can be used in a variety of different applications. As alluded to above, one particular application is in the fabrication of absorber layers in photovoltaic applications. Such an exemplary implementation of the present techniques in the fabrication of a photovoltaic device is now described by way of reference to methodology 100 depicted in FIG. 1. It is to be understood that this is merely one example of a multitude of different uses of the present techniques and is merely being provided herein to further illustrate the teachings. It should in no way be construed that the present techniques are to be limited to photovoltaic device synthesis applications.

In step 102, to begin the photovoltaic device fabrication process, a substrate is provided. Suitable substrates include, but are not limited to, a metal foil substrate, a glass substrate, a ceramic substrate, aluminum foil coated with a (conductive) layer of molybdenum, a polymer substrate, and any combination thereof. Further, as described above, if the substrate material itself is not inherently conducting then the substrate is preferably coated with a conductive coating/layer. By way of example only, the substrate used in the examples below is a glass substrate that has been coated with a layer of a conductive material, in this case molybdenum (Mo), which may be coated on the substrate using sputtering or evaporation.

Next, the process of forming an absorber layer on the substrate begins with preparation of the present aqueous selenium-containing solution as provided above. Namely, as described above, the aqueous selenium-containing solution is prepared by contacting i) water, ii) ammonium hydroxide, iii) elemental selenium, and iv) elemental aluminum under conditions sufficient to form the aqueous selenium-containing solution. The process conditions can optionally include sonication for a period of time of from about 1 minute to about 1 hour, and ranges therebetween and/or stirring for a period of time of from about 10 minutes to about 72 hours, and ranges therebetween. The process (i.e., bringing into contact the reagents, sonicating, stirring, etc.) are all conducted at room temperature (i.e., a temperature of from about 20° C. to about 25° C., and ranges therebetween).

As provided above, insoluble aluminum oxide/hydroxide may be formed as a side product. This insoluble aluminum oxide/hydroxide product can be separated from the solution by standard techniques including, but not limited to, centrifugation and filtration. This step will purify the aqueous selenium-containing solution by separating insoluble product from the aqueous selenium-containing solution.

In step 106, the aqueous selenium-containing solution is then contacted (e.g., mixed) with a solution containing one or more of copper (Cu), zinc (Zn) and tin (Sn). The mixture may be sonicated for a period of time of from about 5 minutes to about 30 minutes, and ranges therebetween, to form a slurry (see example below).

As described above, the aqueous selenium-containing solution may optionally be used to dissolve additional selenium and/or chalcogenides if so desired. A suitable chalcogenide is, e.g., tin sulfide (SnS). Thus, if SnS for instance is already dissolved in the aqueous selenium-containing solution, then an additional source of Sn in step 106 is not needed (the solution mixed with the aqueous selenium-containing solution might only contain copper and zinc).

In step 108, the slurry formed in step 106 is then deposited onto the substrate (for example, onto the conductive layer (e.g., Mo) formed on the (e.g., glass) substrate). Suitable deposition methods include, but are not limited to: spin-coating, dip-coating, doctor blading, curtain coating, slide coating, spraying, slit casting, meniscus coating, screen printing, ink jet printing, pad printing, flexographic printing and/or gravure printing. Multiple spin coating steps (each followed by a drying step) may be employed to ensure adequate coverage of the material on the substrate. The layer or layers of the material (in this case CZTSe or CZTSSe) formed on the substrate in this step will serve as an absorber layer of the device.

In step 110, an n-type semiconducting layer is then formed on the absorber layer. According to an exemplary embodiment, the n-type semiconducting layer is formed from zinc sulfide (ZnS), cadmium sulfide (CdS), indium sulfide (InS), oxides thereof and/or selenides thereof, which is deposited on the absorber layer using for example vacuum evaporation, chemical bath deposition, electrochemical deposition, atomic layer deposition (ALD), and Successive Ionic Layer Adsorption And Reaction (SILAR).

Finally, in step 112, a top electrode is formed on the n-type semiconducting layer. As highlighted above, the substrate (if inherently conducting) or the layer of conductive material serves as a bottom electrode of the device. The top electrode is formed from a transparent conductive material, such as doped zinc oxide (ZnO), indium-tin-oxide (ITO), doped tin oxide or carbon nanotubes. The process for forming an electrode from these materials would be apparent to one of skill in the art and thus is not described further herein.

The present techniques are further illustrated by way of the following non-limiting examples.

Example 1

2 grams (g) of selenium and 0.7 g of aluminum powder were added to 10 milliliters (ml) of ammonium hydroxide. The solution was sonicated for 5 minutes and then stirred for 72 hours yielding a red solution of selenium (partially reduced) and a solid product containing aluminum oxide/hydroxide.

Example 2

1 g of selenium and 2 g of aluminum powder were added to 10 ml of ammonium hydroxide. The solution was sonicated for 5 minutes and stirred for 12 hours yielding a transparent solution of selenium (completely reduced) and a solid product containing aluminum and aluminum oxide/hydroxide.

Example 3

The solutions from Example 1 and Example 2 were mixed and stirred for 12 hours, yielding a transparent solution of selenium (completely reduced) and a solid product containing aluminum and aluminum oxide/hydroxide. The total volume was adjusted to 25 ml with water addition. The mixture was subjected to centrifugation and filtered through a 0.1 micron syringe filter (solution A).

A slurry B was prepared as follows: Approximately 2.4 mmol $Zn(NO_3)_{2x}XH_2O$ and 3.6 mmol $Cu(NO_3)_{2x2} \cdot 5H_2O$ were mixed with 2 mmol tin (Sn), reacted previously with 1 ml 68% $HNO_3$ to form insoluble oxide/hydroxide product. The solution was finally neutralized with ammonium hydroxide to pH 7, forming a slurry. 10 ml of solution A was the added to slurry B.

Mixing solution A and slurry B, followed by sonication for 30 minutes and stirring for 10 minutes resulted in the formation of a dark-brown slurry C. A thin layer of slurry C was spun at 800 revolutions per minute (rpm) onto a molybdenum (Mo)-coated glass substrate and annealed on a hot plate at 425° C. for 1 min with no cover (i.e., so as to remove the water from the slurry). Incomplete coverage of the substrate (visible pores) was observed at this point. 200 microliters of slurry C were subsequently cast on top of the first layer and dried with a halogen lamp. The substrate was placed on a hot plate at 540° C. with no cover for about 30 seconds (to allow elimination of byproducts such as ammonium nitrate, resulting in white smoke release), then covered with a clean quartz cover and annealed for 5 minutes. The result is a CZTSe layer on the (Mo-coated glass) substrate. As described above, the CZTSe layer may serve as an absorber layer in a photovoltaic device.

Example 4

10 g of selenium and 6.6 g of aluminum were added to 20 ml ammonium hydroxide in 40 ml of water. The mixture was stirred for 24 hours, decanted and filtered to yield a yellowish transparent solution (fully reduced). To 4 ml of the yellowish transparent solution, 1 g of selenium was added and stirred for 12 hours leading to complete dissolution.

Example 5

10 g of selenium and 6.6 g of aluminum were added to 20 ml ammonium hydroxide in 40 ml of water. The mixture was stirred for 24 hours, decanted and filtered to yield yellowish transparent solution (fully reduced). To 2 ml of said yellowish transparent solution, 0.5 g of selenium and 0.06 g of tin sulfide (SnS) were added and stirred for 12 hours leading to complete dissolution.

Figure 2:
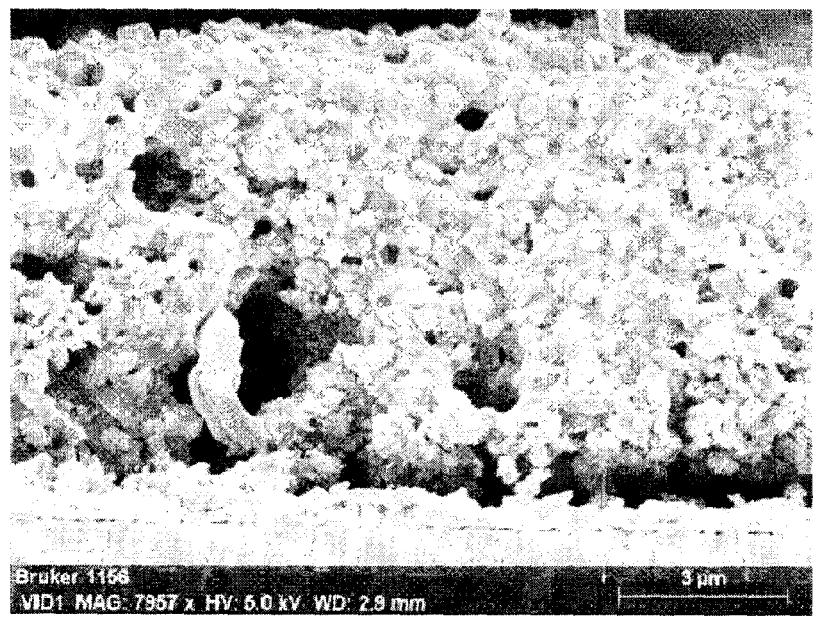
FIG. 2 is a cross-sectional scanning electron micrograph (SEM) image of a CZTSe film obtained using the above-described techniques according to an embodiment of the present invention.
Figure 3:
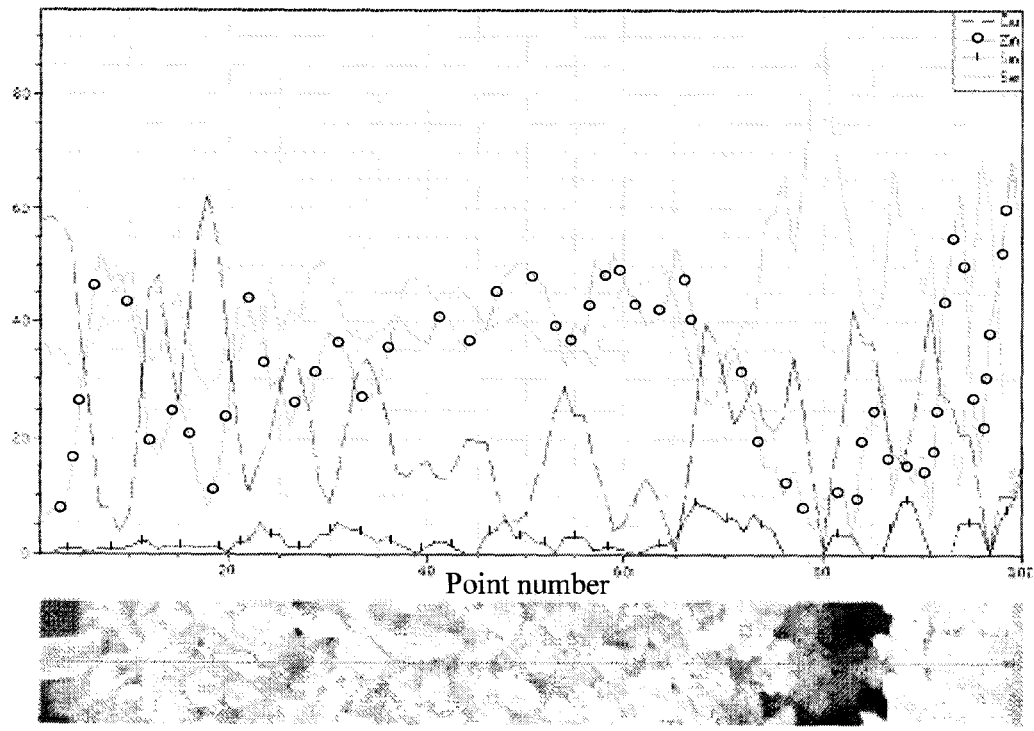
FIG. 3 is a diagram illustrating an energy dispersive x-ray analysis (EDX) compositional profile of a CZTSe film obtained using the above-described techniques according to an embodiment of the present invention.

FIG. 2 is a cross-sectional scanning electron micrograph (SEM) image 200 of a CZTSe film obtained using the above-described techniques. FIG. 3 is a diagram illustrating an energy dispersive x-ray analysis (EDX) compositional profile 300 of the CZTSe film obtained using the above-described techniques, with average selenium content of about 43%, demonstrating one application of the present techniques as a selenium source for metal selenide synthesis.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a photovoltaic device, the method comprising the steps of:
    contacting an aqueous selenium-containing solution with a solution containing one or more of copper, zinc and tin to form a slurry, wherein the aqueous selenium-containing solution is formed by (a) contacting i) water, ii) ammonium hydroxide, iii) elemental selenium, and iv) elemental aluminum under conditions sufficient to form the aqueous selenium-containing solution and (b) filtering the aqueous selenium-containing solution to separate insoluble materials from the aqueous selenium-containing solution; and
    depositing the slurry onto a substrate; and
    removing the water from the slurry to form an absorber layer on the substrate.

2. The method of claim 1, wherein the substrate is coated with a layer of a conductive material.

3. The method of claim 1, wherein the conditions comprise sonication for a period of time of from about 1 minute to about 10 minutes.

4. The method of claim 1, wherein the conditions comprise stirring for a period of time of from about 10 minutes to about 72 hours.

5. The method of claim 1, wherein the conditions comprise a temperature of from about 20° C. to about 25° C.

6. The method of claim 1, wherein the aqueous selenium-containing solution comprises $Se^{2-}$ ions and is clear.

7. The method of claim 1, further comprising the step of:
contacting the aqueous selenium-containing solution with additional amounts of elemental selenium to increase selenium concentration in the aqueous selenium-containing solution.

8. The method of claim 7, wherein the aqueous selenium-containing solution comprises polyselenide ions and is red in color.

9. The method of claim 1, further comprising the step of:
adding a chalcogenide to the aqueous selenium-containing solution.

10. The method of claim 9, wherein the chalcogenide comprises tin sulfide.

11. The method of claim 1, wherein the depositing step is carried out by a method selected from the group consisting of: spin-coating, dip-coating, doctor blading, curtain coating, slide coating, spraying, slit casting, meniscus coating, screen printing, ink jet printing, pad printing, flexographic printing, and gravure printing.

12. The method of claim 1, further comprising the steps of:
forming an n-type semiconducting layer on the absorber layer; and
forming a top electrode on the n-type semiconducting layer.

* * * * *